United States Patent

Takai

[11] Patent Number: 6,055,196
[45] Date of Patent: Apr. 25, 2000

[54] SEMICONDUCTOR DEVICE WITH INCREASED REPLACEMENT EFFICIENCY BY REDUNDANT MEMORY CELL ARRAYS

[75] Inventor: Yasuhiro Takai, Tokyo, Japan

[73] Assignee: NEC Corporation, Tokyo, Japan

[21] Appl. No.: 09/084,107

[22] Filed: May 26, 1998

[30] Foreign Application Priority Data

May 27, 1997 [JP] Japan .................................. 9-136887

[51] Int. Cl.⁷ ...................................................... G11C 7/00
[52] U.S. Cl. .......................................... 365/200; 365/201
[58] Field of Search .................................. 365/200, 201, 365/225.7, 210

[56] References Cited

U.S. PATENT DOCUMENTS 5,349,556  9/1994  Lee ........................................... 365/200
5,396,124  3/1995  Sawada et al. ........................... 365/200
5,717,651  2/1998  Kikukawa et al. ....................... 365/233

FOREIGN PATENT DOCUMENTS 7-176200  7/1995  Japan .
9-167499  6/1997  Japan .

*Primary Examiner*—David Nelms
*Assistant Examiner*—David Lam
*Attorney, Agent, or Firm*—Foley & Lardner

[57] ABSTRACT

A semiconductor memory device is disclosed that allows an increase in the replacement efficiency by redundant memory cell arrays. Redundant row address judging circuits output redundant row selection signals for differing banks, whereby redundant row selection signals are not outputted to other banks in cases in which row addresses of defective memory cells have been programmed to replace the word lines of a particular bank by a redundant memory cell array.

4 Claims, 8 Drawing Sheets

SEMICONDUCTOR DEVICE WITH INCREASED REPLACEMENT EFFICIENCY BY REDUNDANT MEMORY CELL ARRAYS

BACKGROUND OF THE INVENTION

1. Field of the Invention

The present invention relates to a semiconductor memory device comprising a plurality of banks and having redundant word lines and redundant bit lines.

2. Description of the Related Art

If the memory cells of a particular memory cell array become defective in a semiconductor memory device having a plurality of memory cell arrays, the functions of the defective memory cells are compensated for by replacing the rows including the defective memory cells by a redundant memory cell array that has been prepared in advance.

FIG. 1 is a block diagram showing the configuration of such a semiconductor memory device of the prior art. This prior-art semiconductor memory device comprises four memory cell plates. The memory cell plates comprises normal memory cell arrays $11A_1$, $11A_2$, $11A_3$, and $11A_4$, and redundant memory cell arrays $13A_1$, $13A_2$, $13A_3$, and $13A_1$, respectively. In the prior-art example, moreover, a shared sense amplifier system is employed wherein sense amplifiers $15A_1$, $15A_2$, $15A_3$, $15A_4$, and $15A_8$ are shared by the memory cell plates from left to right.

In addition, reading and writing of data is carried out in each of the memory cell plates by means of redundant word line drivers $14A_1$–$14A_4$, normal row decoders $12A_1$–$12A_4$, and redundant row address judging circuits $16A_1$–$16A_4$.

Normal row decoders $12A_1$–$12A_4$ activate address word lines designated by address signals 21.

When redundant row selection signals $22A_1$–$22A_4$ become active, respective redundant word line drivers $14A_1$–$14A_4$ activate word lines connected to redundant memory cell arrays $13A_1$–$13A_4$.

The addresses of memory cells judged to be defective are programmed in advance, and when addresses designated by address signal 21 match these programmed addresses, redundant row address judging circuits $16A_1$–$16A_4$ activate redundant row selection signals $22A_1$–$22A_4$, respectively.

Although signals other than address signals 21 are inputted to redundant row address judging circuits $16A_1$–$16A_4$, such signals are here omitted in the interest of simplifying the explanation.

The circuit diagram of redundant row address judging circuit $16A_1$, will next be explained with reference to FIG. 2.

Redundant row address judging circuit $16A_1$ comprises n-channel MOSFETs $42_1$–$42_9$, fuse elements $43_1$–$43_9$, p-channel MOSFET 31, inverter 33, p-channel MOSFET 32, n-channel MOSFET 34A, p-channel MOSFET 37A, and inverters 35A and 36A.

Complementary address signals $41_1$–$41_9$ are connected to the gates of n-channel MOSFETs $42_1$–$42_9$, respectively. Complementary address signals $41_1$–$41_9$ are signals comprises row addresses designated by address signal 21 and signals in which each of the bits of row addresses are inverted.

Fuse elements $43_1$–$43_9$ are provided between node 54 and each of n-channel MOSFETs $42_1$–$42_9$ and are opened by cutting with a laser beam. P-channel MOSFET 31 turns ON and precharges node 54 when redundant row address judging circuit precharge signal 51 becomes active.

Inverter 33 and p-channel MOSFET 32 both hold the potential of node 54 at a stable level and invert the potential of node 54 and output the result.

N-channel MOSFET 34A turns ON when redundant row selection signal latch circuit 52A becomes active and inputs the output of inverter 33 to inverter 35A.

P-channel MOSFET 37A precharges the input of inverter 35A when redundant row selection signal precharge signal 53A becomes active.

Inverters 35A and 36B both hold the potential transferred by means of n-channel MOSFET 34A and invert the potential and output the result as redundant row selection signal $22A_1$.

Explanation will next be presented regarding the operation of the prior-art semiconductor memory device with reference to FIG. 1 and FIG. 2.

First, if a particular defective memory cell is discovered in the wafer inspection process of a semiconductor memory device, the necessary elements of fuse elements $43_1$–$43_9$ are cut based on the row address of the address of the defective memory cell and a signal in which each bit of the row address is inverted, thereby programming and storing the addresses of defective memory cells.

Regarding the operation in a case in which defective memory cells are replaced by redundant memory cells, redundant row address judging circuit precharge signal 51 and redundant row selection signal precharge signal 53A first become active, and node 54 and the input of inverter 35A are precharged to a fixed voltage.

Then, if complementary address signals $41_1$–$41_9$ are the same as row addresses that have been programmed in advance, node 54, which has been charged in advance by pchannel MOSFET 31, remains at the precharged voltage without discharging because the fuse elements of corresponding addresses have been cut. Redundant row selection signal $22A_1$ is then activated by the activation of redundant selection signal latch signal 52A, whereby redundant word line driver $14A_1$ is activated and the word line connected to redundant memory cell array $13A_1$ becomes active. Although not shown in the figure, the normal word line is simultaneously deactivated.

Operations for reading and writing data are carried out as usual at redundant row address judging circuit $16A_1$ if the row addresses designated by inputted address signal 21 do not match with the pre-programmed row addresses. In such a case, any of normal row decoders $12A_1$–$12A_4$ operates in accordance with the row addresses designated by address signals 21, and the normal word lines of any of normal memory cell arrays $11A_1$–$11A_4$ become active.

Redundant row address judging circuits $16A_2$–$16A_4$ operate in the same way as redundant row address judging circuit $16A_1$ and explanation of their operation is therefore omitted.

In this semiconductor memory device of the prior art, the normal word lines that can be replaced by redundant row address judging circuits $16A_1$–$16A_4$ are not limited to those of just one memory cell plate, but can be the normal word lines of any memory cell plate of the four memory cell plates. For example, if the address of normal memory cell array $11A_2$ is programmed at redundant row address judging circuit $16A_1$, a normal word line of normal memory cell array $11A_2$ can be replaced by redundant memory cell array $13A_1$ by redundant row address judging circuit $16A_1$.

Redundant row address judging circuits $16A_1$–$16A_4$ can therefore replace the normal word lines of any memory cell plate, resulting in a redundancy configuration having four redundant word lines for every four plates. As a result, four defective memory cells can all be replaced even if the four defective memory cells are concentrated in one particular memory cell plate. This method therefore has a replacement efficiency that is higher than a redundancy configuration that does not adopt this method and has just one redundant word line per plate. This method is particularly effective in cases in which the occurrence of defective memory cells is biased.

In a semiconductor memory device constructed from a plurality of memory cell plates according to the prior art, an interleaved operation is carried out to enable rapid access of data by dividing the plurality of memory cell plates into a plurality of banks, which are the units by which data are accessed. Explanation will next be presented regarding a case in which redundant memory cells are provided in a semiconductor memory device configured in this way.

FIG. 3 is a block diagram of a semiconductor memory device having a two-bank configuration, which is one example of this type of the prior art. Of the four memory cell plates of FIG. 3, the two plates on the left are allotted to bank A and the two plates on the right side are allotted to bank B. In other words, bank A comprises normal memory cell arrays $11A_1$ and $11A_2$ and redundant memory cell arrays $13A_1$ and $13A_2$, and bank B comprises normal memory cell arrays $11B_1$ and $11B_2$ and redundant memory cell arrays $13B_1$ and $13B_2$. Since normal memory cell arrays $11A_2$ and $11B_1$ belong to different banks, the word lines of each can be selected simultaneously. As a result, these two normal cell arrays cannot share a common sense amplifier, and sense amplifiers $15A_9$ and $15B_1$ are therefore provided for the respective memory cell plates.

In this semiconductor memory device of the prior art, redundant row address judging circuit $16A_1$ can replace only the word lines of either normal memory cell array $11A_1$ or $11A_2$ of bank A. This is because problems occur if redundant memory cell array $13A_1$ is addressed with a particular word line of normal memory cell array $11B_1$ of bank B using redundant row address judging circuit $16A_1$. Such problems occur because there are cases in which normal memory cell array $11A_1$ and redundant memory cell array $13A_1$, which share the use of sense amplifier $15A_1$, are simultaneously active when a memory cell of normal memory cell array $11A_1$ is selected.

Therefore, when a semiconductor memory device having the same memory cell array configuration as shown in FIG. 1 is divided between two banks as shown in FIG. 3, the memory cell plates that can be replaced by one redundant row address judging circuit are reduced by half. As a consequence, a semiconductor memory device of the configuration shown in FIG. 3 has a redundancy configuration with two redundant word lines for every two plates, and this configuration results in a drop in the replacement efficiency compared with a redundancy configuration having four redundant word lines for every four plates as shown in FIG. 1.

In other words, when the prior-art method is applied to a semiconductor memory device as described hereinabove whereby a bank configuration is adopted that can independently access row addresses in the interior and simultaneously select a plurality of word lines as in, for example, synchronous DRAM, the redundant replacement region is divided in accordance with the provision of a plurality of banks, and redundancy judging and replacement must be performed independently at each bank, thereby decreasing the replacement efficiency.

This problem can be solved by increasing the number of redundant memory cell arrays or providing redundant row address judging circuits for each bank. However, in the current state of the art of LSI fabrication, there are physical limits to the dimensions of fuse elements because fuse elements are cut by laser beams. Fuse elements consequently cannot be scaled and reduced in proportion to the wiring or transistors. In actuality, therefore, the number of fuse elements that can be provided on a 256-Mbit DRAM is limited by the size of the chip, and the number of redundant row address judging circuits cannot be increased.

A method is disclosed in Japanese Patent Laid-open No. 7(1995)-176200 for raising replacement efficiency without bringing about an increase in chip area as described hereinabove. A semiconductor memory device in which this prior-art configuration is applied to a two-bank configuration having two memory plates in one bank will next be described with reference to FIG. 4.

In addition to the semiconductor memory device shown in FIG. 3, the semiconductor memory device of the prior art shown in FIG. 4 provides redundant memory cell arrays $13B_1$–$13B_4$ for each memory plate, with two redundant memory cell arrays for each memory plate. In addition, redundancy word line drivers $14B_1$–$14B_4$ are provided for redundant memory cell arrays $13B_1$–$13B_4$, respectively. Finally, redundant line selection signals $22A_1$–$22A_4$ are inputted to redundant word line drivers $14B_1$–$14B_4$, respectively.

In this semiconductor memory device of the prior art, word lines of the memory plate of bank A can be replaced if redundant row address judging circuit $16A_1$ uses redundant memory cell array $13A_1$, and word lines of the memory cell plate of bank B can be replaced if redundant memory cell array $13B_1$ is used. As a result, in a semiconductor memory device of two-bank configuration, the same replacement efficiency can be obtained with just four redundant row address judging circuits as for a redundancy configuration having four redundant word lines for each four plates.

However, in a case in which redundant row address judging circuit $16A_1$ in this semiconductor memory device of the prior art replaces the word lines of a particular row address in bank A with redundant memory cell array $13A_1$, redundant memory cell array $13B_1$ forcibly replaces the word line at that row address of bank B.

Ordinarily, normal memory cell arrays $11A_1$, $11A_2$, $11B_1$, and $11B_2$ are inspected by, for example, an operation check, but no inspections such as operation checks are performed for redundant memory cell arrays $13A_1$–$13A_4$ and $13B_1$–$13B_4$, with the result that memory word lines that are not defective are needlessly replaced with still unchecked redundant memory cell arrays.

SUMMARY OF THE INVENTION

It is an object of the present invention to provide a semiconductor memory device in which, despite replacement of a word line of a particular bank by a redundant memory cell array, word lines of other banks are not needlessly replaced by redundant memory cell arrays.

To achieve the above-described object, the semiconductor memory device of this present invention includes a plurality of redundancy row address judging circuits that store in advance the row addresses of word lines in which defective memory cells exist and the addresses of banks in which defective memory cells exist, and that output, for each bank, redundant row selection signals for activating a redundant memory cell array when the row address of a word line in which defective memory cells exist is designated by address signals.

The redundant row address judging circuit in this invention can output redundant row selection signals for each bank, and therefore does not needlessly output redundant row selection signals to other banks even in cases in which the row addresses of defective memory cells are programmed in order to replace the word lines of a particular bank with a redundant memory cell array.

Accordingly, in a case in which the word lines of a particular bank are replaced by a redundant memory cell array, the word lines of other banks are not needlessly replaced by redundant memory cell arrays. In addition, the replacement efficiency improves for cases in which memory cells of the same row address in a differing bank are defective.

In addition, another semiconductor memory device according to the present invention includes a plurality of redundancy column address judging circuits that store in advance the column addresses of bit lines in which defective memory cells exist and the addresses of banks in which defective memory cells exist, and that output, for each bank, redundant column selection signals for activating a redundant memory cell array when the column address of a bit line in which defective memory cells exist is designated by address signals. The redundant column address judging circuit includes a device for storing column addresses of bit lines in which defective memory cells exist. The addresses of the banks in which defective memory cells exist is determined by the presence or absence of a cut in a plurality of fuse elements.

The redundant column address judging circuit in this invention can output redundant column selection signals for each bank, and therefore does not needlessly output redundant column selection signals to other banks even in cases in which the column addresses of defective memory cells are programmed in order to replace the bit lines of a particular bank with a redundant memory cell array.

Accordingly, in a case in which the bit lines of a particular bank are replaced by a redundant memory cell array, the bit lines of other banks are not needlessly replaced by redundant memory cell arrays. In addition, the replacement efficiency improves for cases in which memory cells of the same column address in a differing bank are defective.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 4:
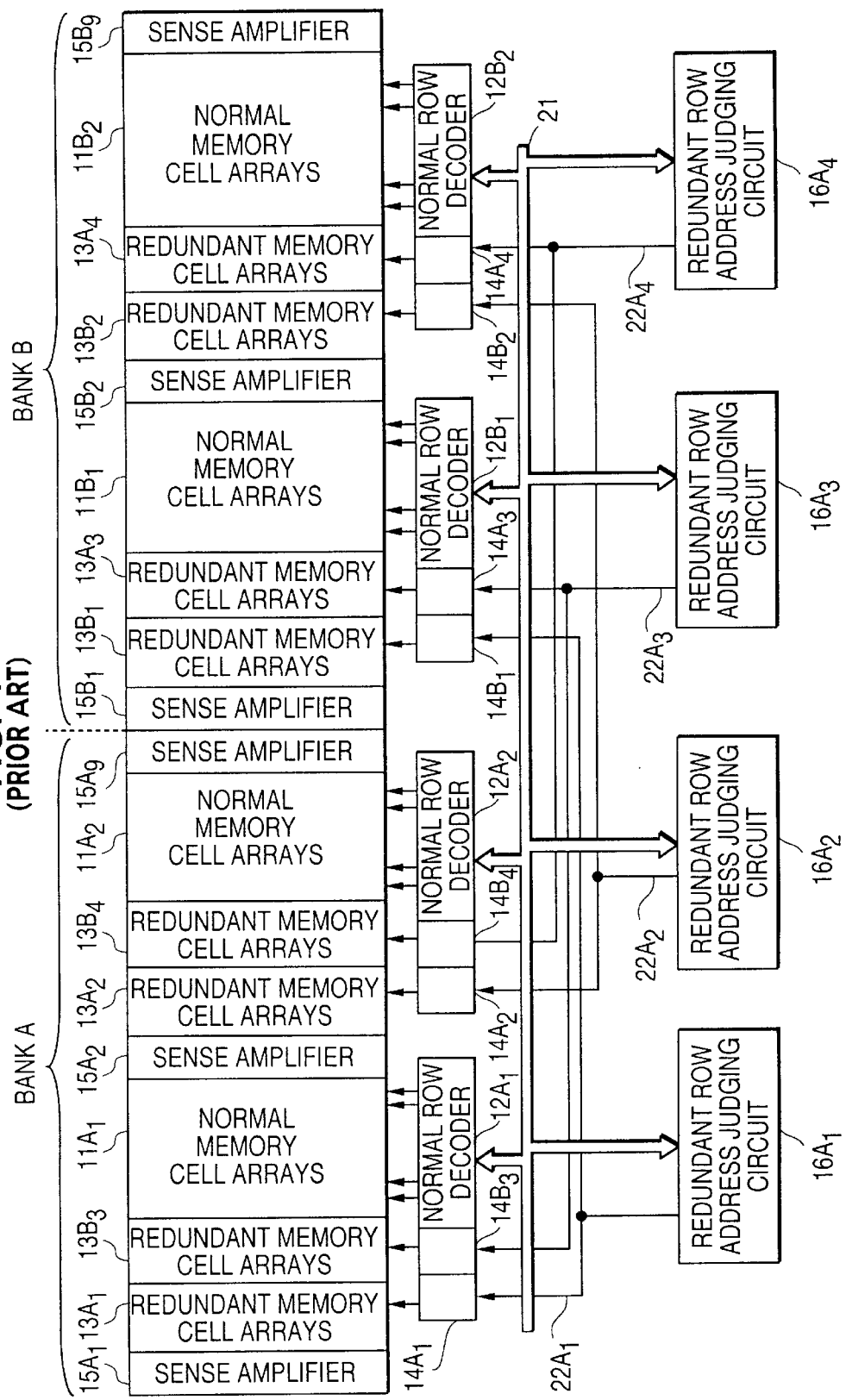
FIG. 4 is a block diagram showing the configuration of another semiconductor memory device of the prior art.
Figure 5:
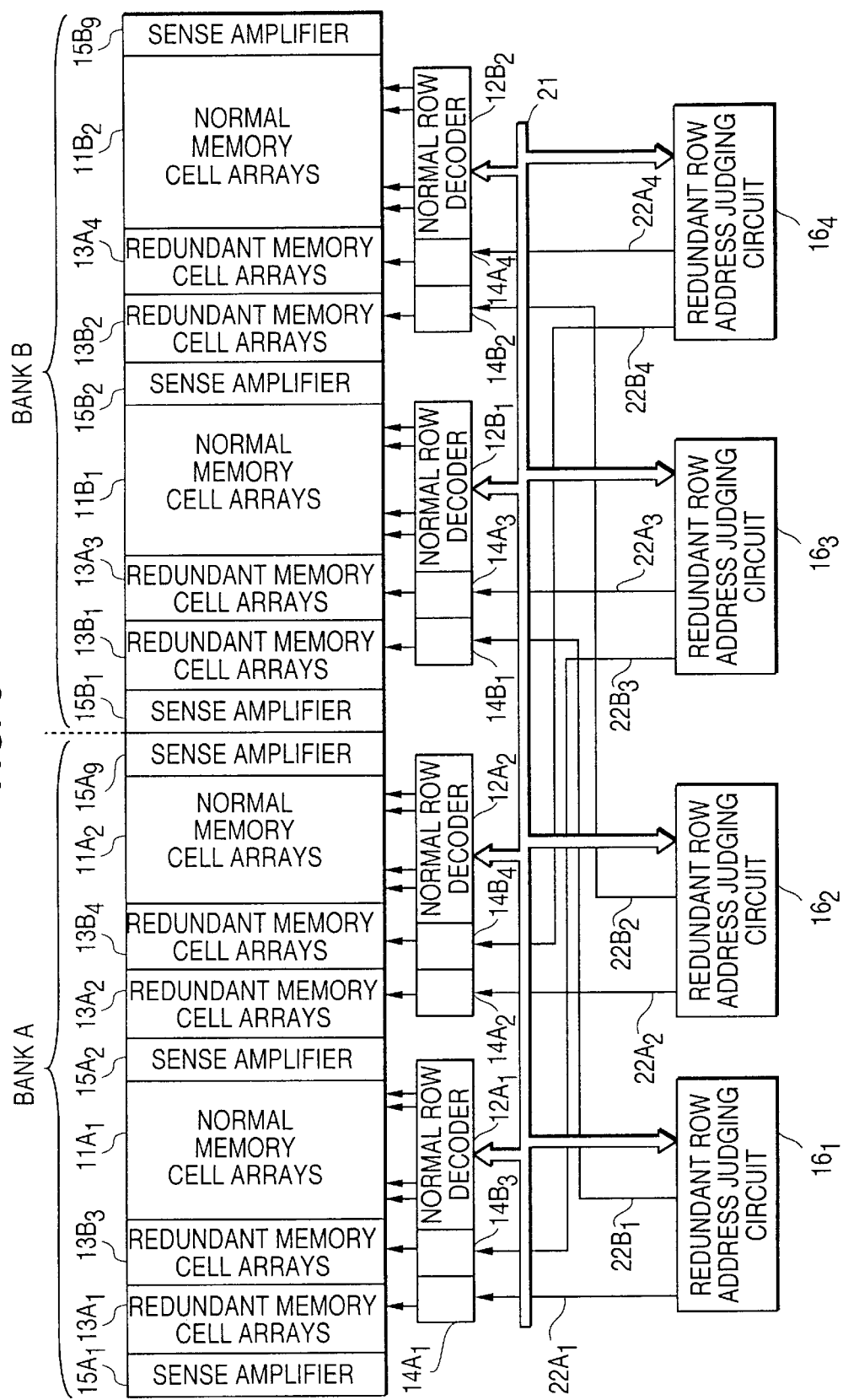
FIG. 5 is a block diagram showing the configuration of an embodiment of the semiconductor memory device according to the present invention.

Referring now to FIG. 5, an embodiment of the semiconductor memory device according to the present invention, in contrast to the prior-art semiconductor memory device of FIG. 4, replaces redundant row address judging circuits $16A_1$–$16A_4$ with redundant row address judging circuits $16_1$–$16_4$, and is configured such that redundant row selection signals $22B_1$–$22B_4$ are inputted to redundant word line drivers $14B_1$–$14B_4$.

One point of difference between this embodiment and the prior art is that, for example, in contrast with redundant row address judging circuit $16A_1$, redundant row address judging circuit $16_1$ outputs redundant row selection signal $22A_1$, which is inputted to redundant memory cell array $13A_1$, and in addition, redundant row selection signal $22B_1$, which is inputted to redundant memory cell array $13B_1$.

Figure 1:
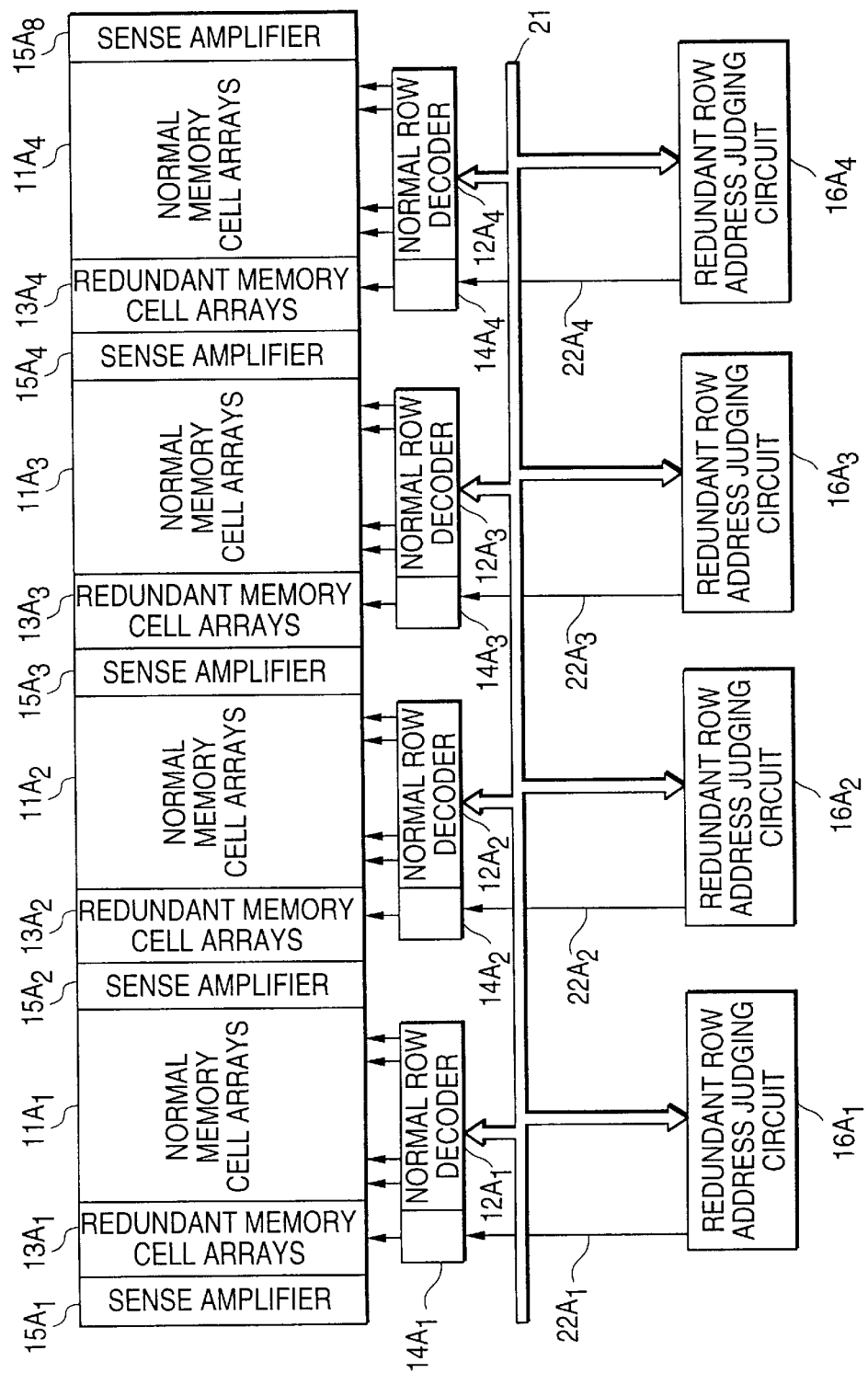
FIG. 1 is a block diagram showing the configuration of a semiconductor memory device of the prior art.
Figure 2:
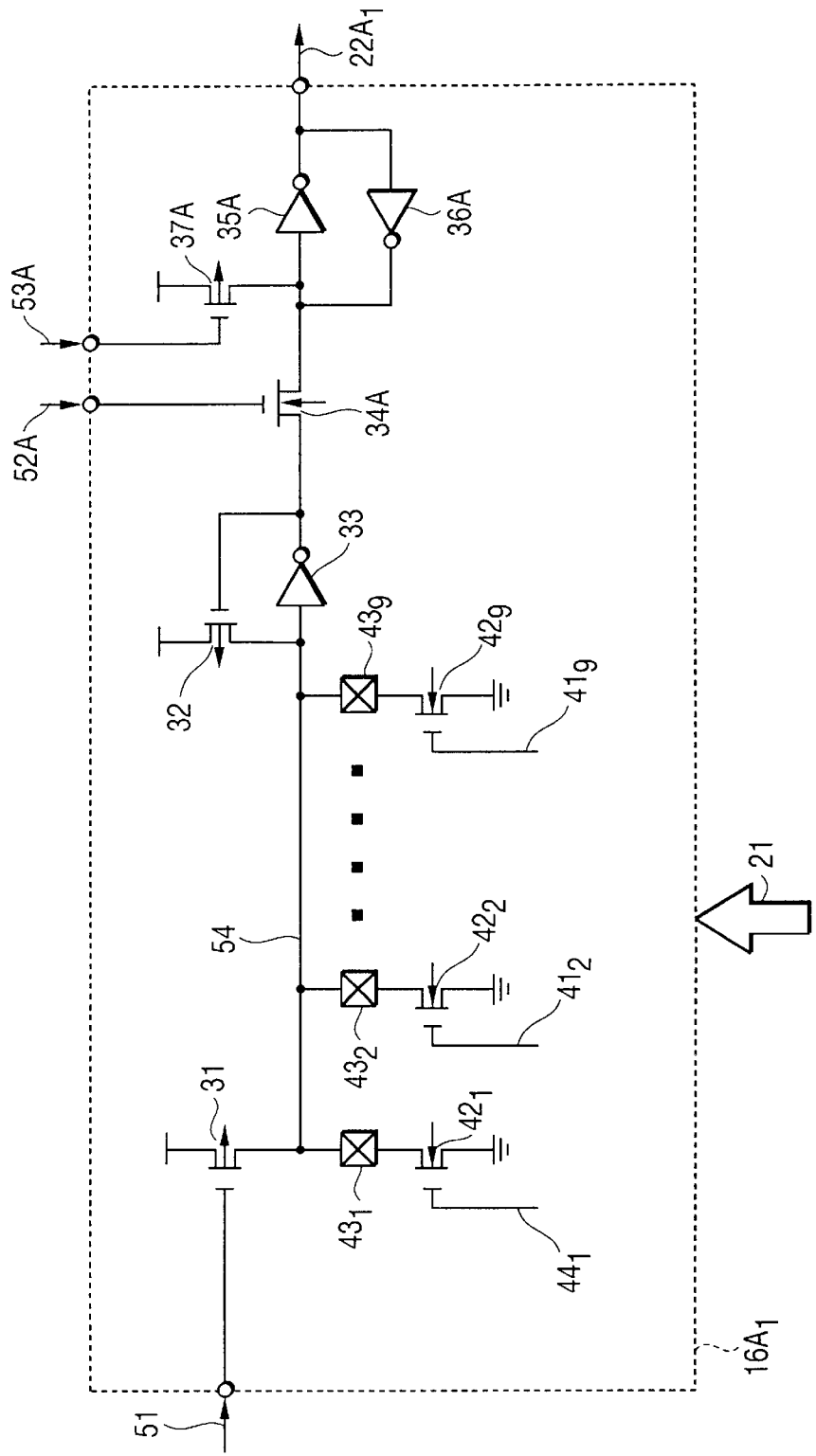
FIG. 2 is a circuit diagram showing redundant row address judging circuit $16A_1$ in FIG. 1.
Figure 3:
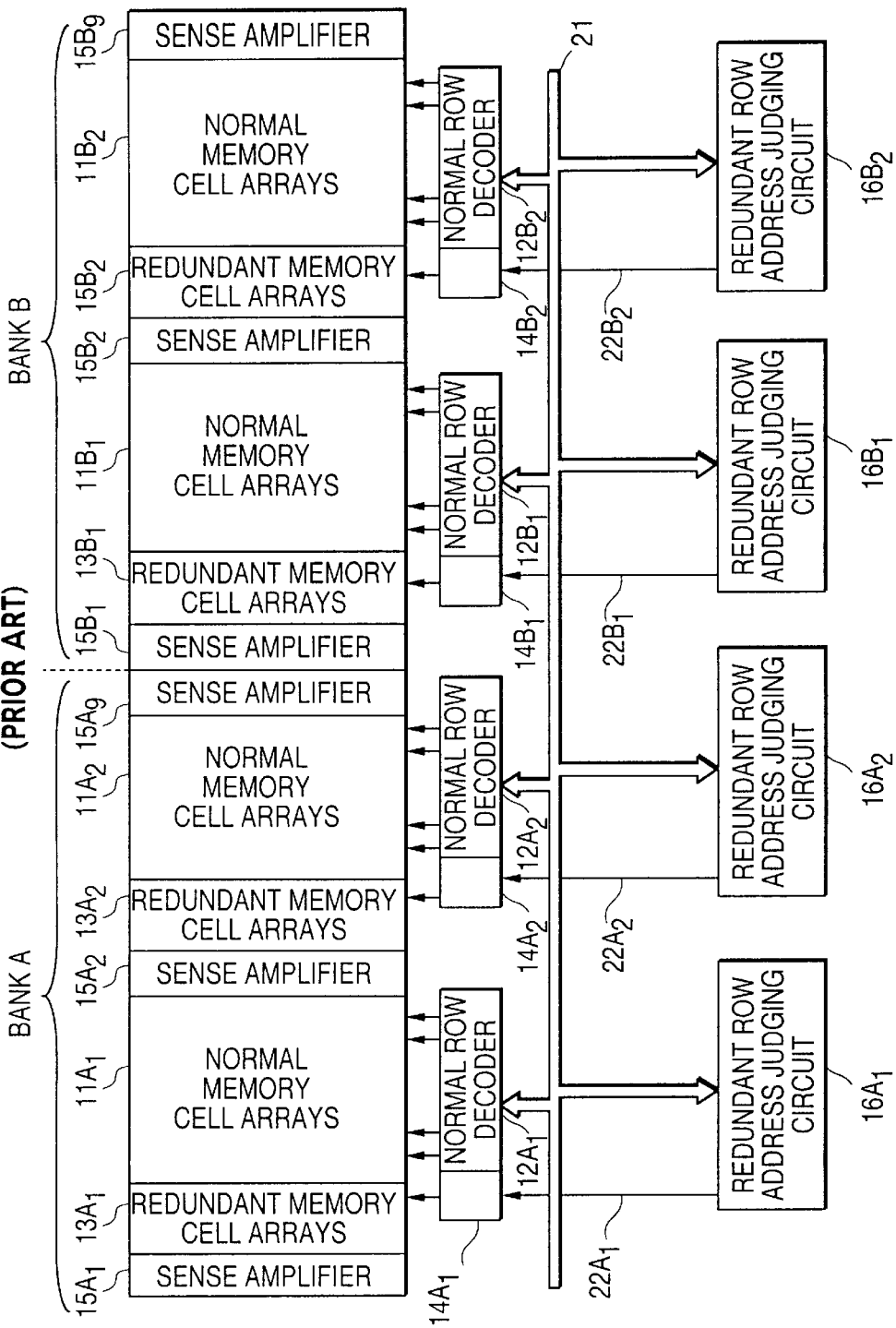
FIG. 3 is a block diagram showing the configuration of another semiconductor memory device of the prior art.
Figure 6:
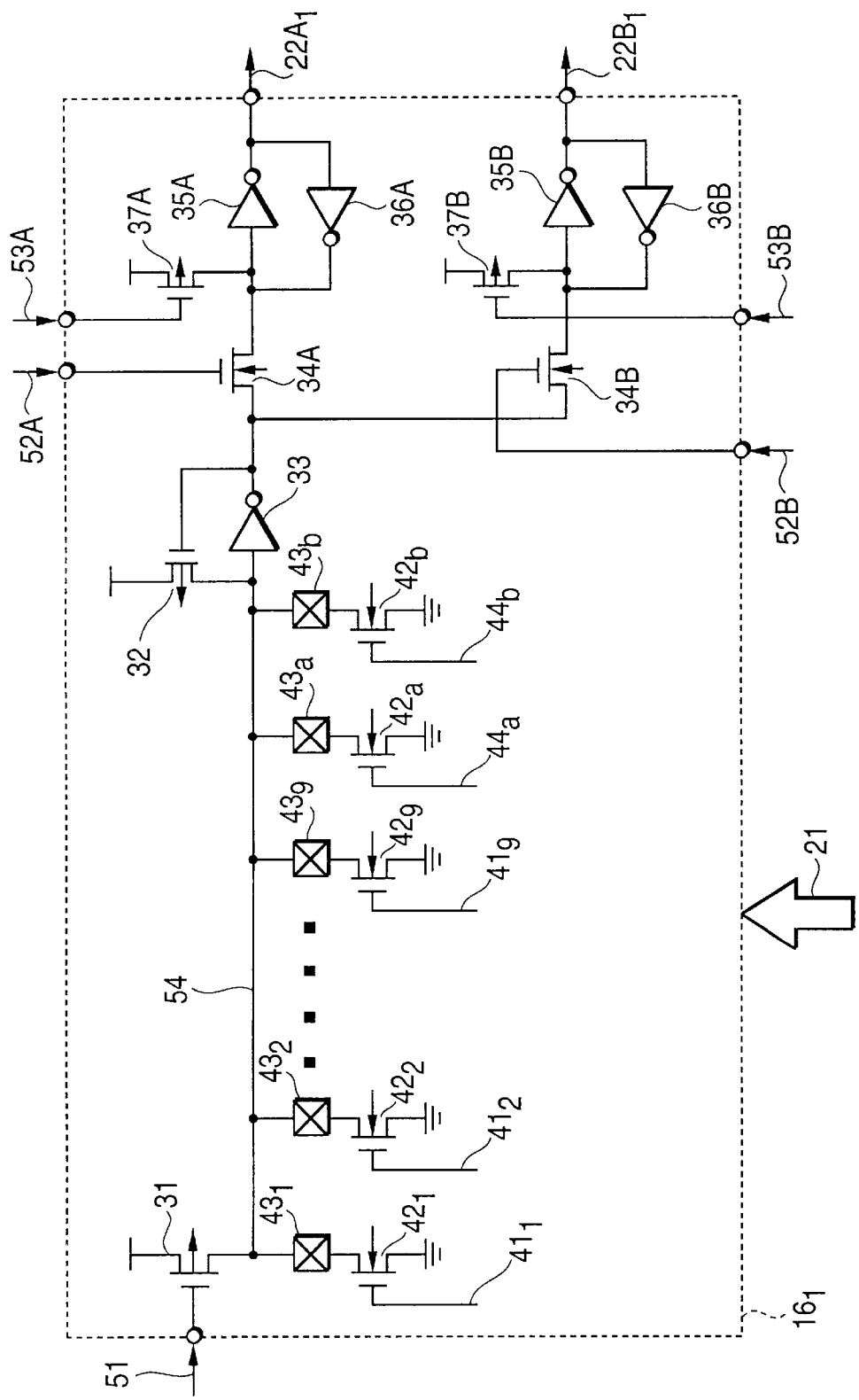
FIG. 6 is a circuit diagram showing redundant row address judging circuit $16A_1$ in FIG. 5.

The configuration and operation of redundant row address judging circuit $16_1$ according to this embodiment will next be described based on FIG. 6. In contrast with the prior art redundant row address judging circuit $16A_1$ shown in FIG. 2, redundant row address judging circuit $16_1$ inputs bank selection signals $44_a$ and $44_b$ in addition to address complementary signals $41_1$, $41_2$, . . . , $41_9$ that are inputted according to address signals 21. In contrast with the prior-art redundant row address judging circuit $16A_1$ shown in FIG. 3, redundant row address judging circuit $16_1$ is further provided with n-channel MOSFETs $42_a$ and $42_b$, fuse elements $43_a$ and $43_b$, n-channel MOSFET 34B, p-channel MOSFET 37B, and inverters 35B and 36B.

The bases of n-channel MOSFETs $42_a$ and $42_b$ are connected to bank selection signals $44_a$ and $44_b$. Fuse elements $43_a$ and $43_b$ are provided between node 54 and each of n-channel MOSFETs $42_a$ and $42_b$.

N-channel MOSFET 34B, p-channel MOSFET 37B, and inverters 35B and 3GB each carry out the same operations as n-channel MOSFET 34A, p-channel MOSFET 37A, and inverters 35A and 36A, respectively.

To program row addresses of bank B in redundant row address judging circuit $16_1$, the appropriate fuse elements $43_1$, $43_2$, . . . $43_9$, and $43_b$ are cut. If the inputted address signals 21 of bank B, i.e., complementary address signals $41_1$, $41_2$, . . . , $41_9$, match a programmed address, bank selection signal $44_b$ is selected and n-channel MOSFET $42_b$ becomes conductive; but node 54, which is charged in advance by p-channel MOSFET 31, does not discharge because fuse element $43_b$ is cut and the fuse elements $43_1$–$43_9$ of the corresponding address are also cut. The activation of redundant row selection signal latch signal 52B of bank B and redundant row selection signal $22B_1$ then causes redundant word line driver $14B_1$ of bank B to become active. Fuse element $43_a$ is similarly cut to program row address of bank A, and in a case in which an inputted address matches, redundant row selection signal latch signal 52A is activated and redundant row selection signal $22A_1$ becomes active.

As explained hereinabove, redundant row address judging circuit $16_1$ can replace any one of the total of four plates including normal memory cell arrays $11B_1$ and $11B_2$ in addition to normal memory cell arrays $11A_1$ and $11A_2$.

The foregoing explanation relates to redundant row address judging circuit $16_1$, but the operation of redundant row address judging circuits $16_2$–$16_4$ is equivalent.

As described hereinabove, the semiconductor memory device of this embodiment is capable of selectively replacing any particular bank rather than all banks, and therefore does not needlessly replace memory that is not defective with redundant memory cell arrays that have not been pretested.

Memory cells at the end portions of memory cell plates tend to become defective because the cyclical nature of the structure of memory cell plates is disrupted at these positions. When it is wished to replace the same specific address in bank A and bank B, the addresses of both banks can be programmed by one redundant row address judging circuit by cutting both fuse elements 43$_a$ and 43$_b$ in the circuit structure of this embodiment. As a result, the circuit configuration of this embodiment has the technical merit of allowing, with almost no increase in the number of fuse elements, a redundancy configuration having a maximum of eight redundant word lines for every four plates, i.e., a doubling of the replacement efficiency.

Although the present embodiment might raise some concern regarding an increase in the number of wiring lines for redundant row selection signals and an accompanying increase in chip size, the number of wiring lines running across a chip can be greatly reduced by encoding output signals of the redundant row address judging circuits and then decoding the signals at the redundant word line drivers after passage through the wiring.

The amount of increase in chip area was tested for a case in which the present embodiment was applied to a particular 256-Mbit DRAM. In the prior art, the chip size was 13.3 mm×23.96 mm, the redundant word lines measured 0.6 $\mu$m per line, and wiring for redundant row selection signals measured 2 $\mu$m. The length in a direction parallel to row decoders increased by 32 sets of redundant word lines per plate, resulting in an increase of 0.6% (32 sets×2 lines×2 plates×0.6 $\mu$m/13.3 mm). In addition, the length in a direction perpendicular to row decoders increased by seven lines for decoded redundant row selection signals, resulting in an increase of 0.1% (7 lines×2 plates×2 $\mu$m/23.96 mm). These amounts of increase are both negligible.

Figure 7:
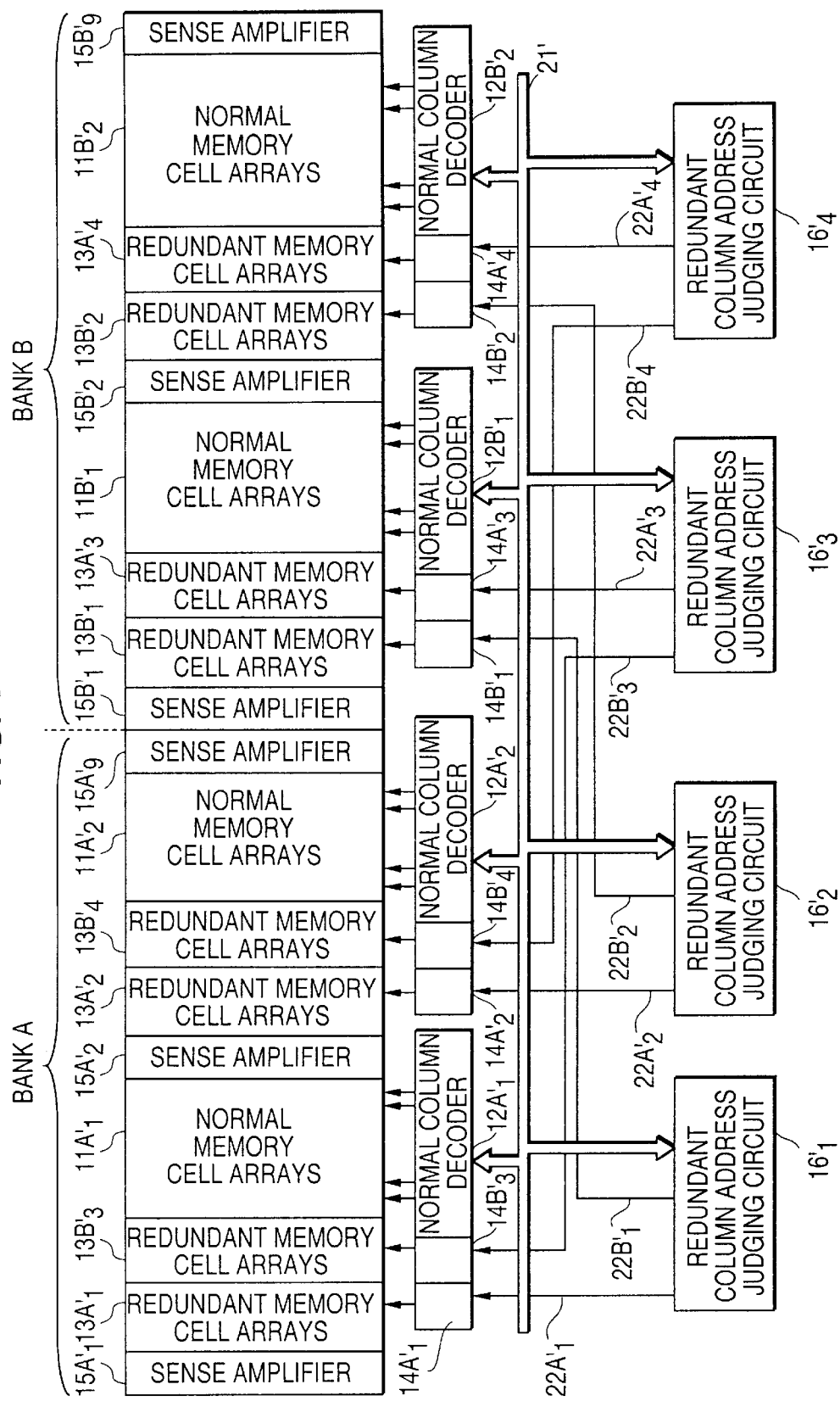
FIG. 7 is a block diagram showing the configuration of a second embodiment of the semiconductor memory device.
Figure 8:
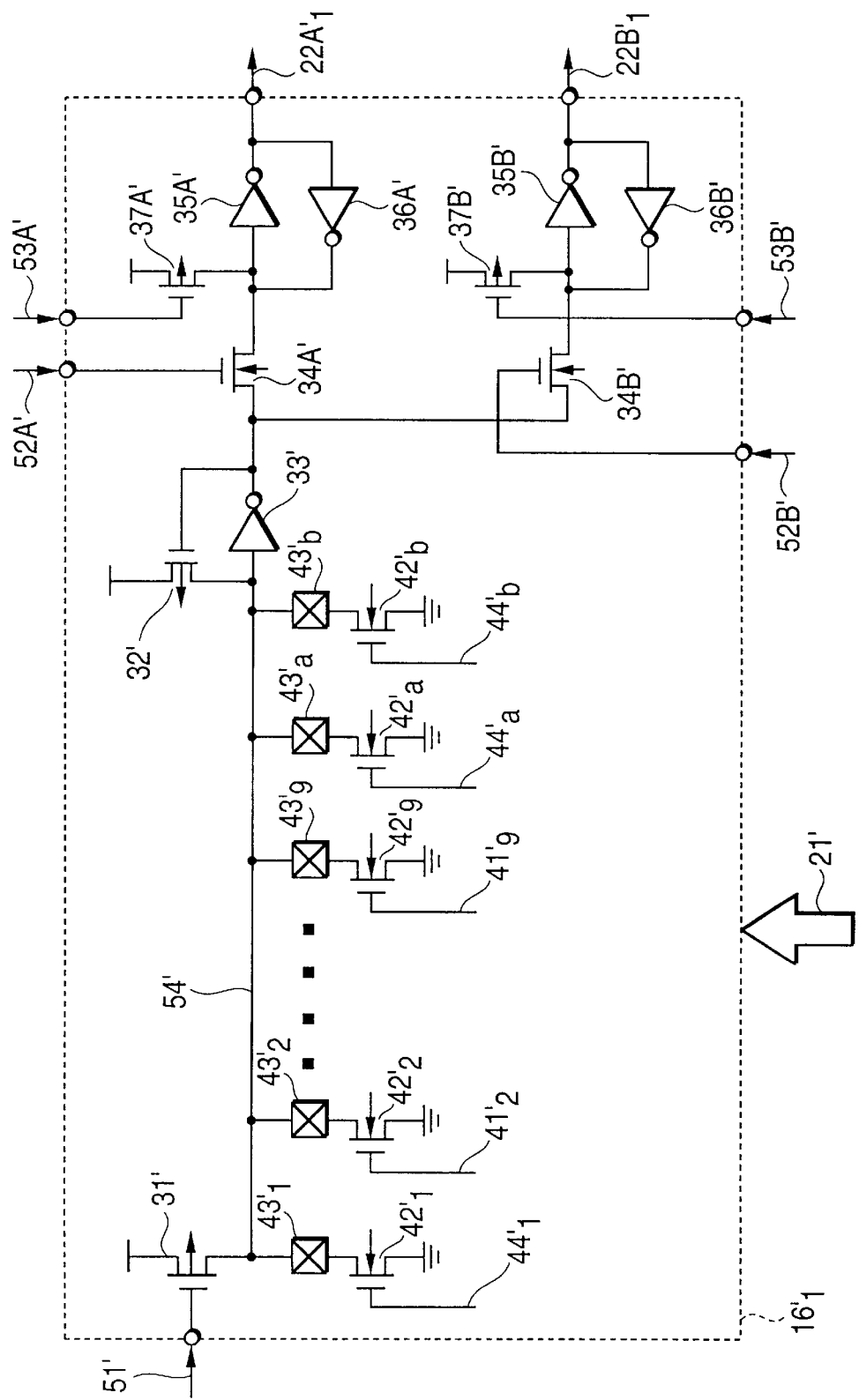
FIG. 8 is a circuit diagram showing a redundant column address judging circuit of FIG. 7.

Although the foregoing explanation of the embodiment relates to a case in which a word line is replaced by a redundant memory cell array, the embodiment may also be applied for a case in which a bit line is replaced by a redundant memory cell array by a similar method. Such an embodiment is shown in FIGS. 7 and 8 which are analogous to FIG. 5, and corresponding elements have thus been labeled with a prime appended to the designations of FIGS. 5 and 6.

While a preferred embodiment of the present invention has been described using specific terms, such description is for illustrative purposes only, and it is to be understood that changes and variations may be made without departing from the spirit or scope of the following claims.

What is claimed is:

1. A semiconductor memory device comprising:

a plurality of banks including: memory cell arrays comprising a plurality of memory cells, and redundant memory cell arrays for replacing word lines in which defective memory cells exist in said memory cell arrays; and a plurality of redundant row address judging circuits that store row addresses of word lines in which defective memory cells exist and addresses of banks in which defective memory cells exist, and independently output, for each of said banks, redundant row selection signals for activating said redundant memory cell arrays when the row address of a word line in which defective memory cells exist is designated by address signals.

2. A semiconductor memory device according to claim 1 wherein each of said redundant row address judging circuits includes a storage device for storing row addresses of word lines in which defective memory cells exist, and addresses of banks in which defective memory cells exist are determined cutting selected ones of a plurality of fuse elements.

3. A semiconductor memory device comprising:

a plurality of banks including: memory cell arrays comprising a plurality of memory cells, and redundant memory cell arrays for replacing bit lines in which defective memory cells exist in said memory cell arrays; and a plurality of redundant column address judging circuits that store column addresses of bit lines in which defective memory cells exist and addresses of banks in which defective memory cells exist, and independently output, for each of said banks, redundant column selection signals for activating said redundant memory cell arrays when the column address of a bit line in which defective memory cells exist is designated by address signals.

4. A semiconductor memory device according to claim 3 wherein each of said redundant column address judging circuits includes a storage device for storing column addresses of bit lines in which defective memory cells exist and addresses of banks in which defective memory cells exist are determined cutting selected ones of a plurality of fuse elements.

\* \* \* \* \*